(12) United States Patent
Kim

(10) Patent No.: US 11,881,456 B2
(45) Date of Patent: Jan. 23, 2024

(54) SEMICONDUCTOR PACKAGE INCLUDING AN INTERPOSER DISPOSED ON A PACKAGE SUBSTRATE AND A CAPPING STRUCTURE DISPOSED ON THE INTERPOSER

(71) Applicant: SAMSUNG ELECTRONICS CO., LTD., Suwon-si (KR)

(72) Inventor: Heonwoo Kim, Cheonan-si (KR)

(73) Assignee: Samsung Electronics Co., Ltd.

(*) Notice: Subject to any disclaimer, the term of this patent is extended or adjusted under 35 U.S.C. 154(b) by 56 days.

(21) Appl. No.: 17/535,887

(22) Filed: Nov. 26, 2021

(65) Prior Publication Data

US 2022/0392844 A1 Dec. 8, 2022

(30) Foreign Application Priority Data

Jun. 7, 2021 (KR) ................. 10-2021-0073300

(51) Int. Cl.
| | |
|---|---|
| *H01L 23/538* | (2006.01) |
| *H01L 25/065* | (2023.01) |
| *H01L 23/12* | (2006.01) |
| *H01L 23/31* | (2006.01) |

(52) U.S. Cl.
CPC .......... *H01L 23/5385* (2013.01); *H01L 23/12* (2013.01); *H01L 23/3114* (2013.01); *H01L 23/5386* (2013.01); *H01L 25/0657* (2013.01)

(58) Field of Classification Search
CPC ............ H01L 23/3114; H01L 23/5386; H01L 23/3128; H01L 23/49816; H01L 23/5384; H01L 23/02; H01L 23/3135; H01L 23/3142; H01L 23/5389; H01L 25/18; H01L 25/0657; H01L 25/105; H01L 23/5385
USPC ......................................................... 257/777
See application file for complete search history.

(56) References Cited

U.S. PATENT DOCUMENTS

| | | |
|---|---|---|
| 7,459,782 B1 | 12/2008 | Li |
| 9,089,051 B2 | 7/2015 | Li et al. |
| 9,570,370 B2 * | 2/2017 | Oh .............. H01L 21/56 |
| 9,685,403 B2 | 6/2017 | Pagaila |
| 9,793,187 B2 | 10/2017 | Lin et al. |
| 10,388,582 B2 | 8/2019 | Kim et al. |
| 10,510,561 B2 | 12/2019 | Tsai et al. |
| 10,541,156 B1 | 1/2020 | Interrante et al. |
| 10,573,579 B2 | 2/2020 | Chen et al. |
| 10,600,706 B2 | 3/2020 | Lee |
| 10,636,765 B2 | 4/2020 | Yang et al. |
| 10,770,405 B2 | 9/2020 | Huang et al. |
| 10,832,986 B2 * | 11/2020 | Cho .............. H01L 24/13 |

(Continued)

OTHER PUBLICATIONS

JP-2013157058-A, Hayashi Junichi "Semiconductor Device" (Year: 2013).*

*Primary Examiner* — Khiem D Nguyen
(74) *Attorney, Agent, or Firm* — Fish & Richardson P.C.

(57) ABSTRACT

A semiconductor package includes; an interposer mounted on a package substrate, a first semiconductor device and a second semiconductor device mounted on the interposer, a molding member including an outer side wall portion covering an outer side surface of the first semiconductor device, and a lower portion covering at least a portion of an upper surface of the interposer, and a capping structure including an outer side wall portion covering the outer side wall portion of the molding member.

20 Claims, 12 Drawing Sheets

(56) References Cited

U.S. PATENT DOCUMENTS

| | | | |
|---|---|---|---|
| 2013/0119528 A1* | 5/2013 | Groothuis | H01L 23/3675 |
| | | | 257/777 |
| 2015/0364455 A1* | 12/2015 | Crobu | H01L 24/33 |
| | | | 257/777 |
| 2018/0261528 A1* | 9/2018 | Chen | H01L 23/36 |
| 2018/0341431 A1* | 11/2018 | Hirobe | H01L 25/0655 |
| 2018/0350754 A1* | 12/2018 | Huang | H01L 21/4853 |
| 2019/0057924 A1* | 2/2019 | Kim | H01L 24/17 |

* cited by examiner

SEMICONDUCTOR PACKAGE INCLUDING AN INTERPOSER DISPOSED ON A PACKAGE SUBSTRATE AND A CAPPING STRUCTURE DISPOSED ON THE INTERPOSER

CROSS TO REFERENCE TO RELATED APPLICATION(S)

This application claims priority under 35 U.S.C. § 119 to Korean Patent Application No. 10-2021-0073300 filed on Jun. 7, 2021 in the Korean Intellectual Property Office, the subject matter of which is hereby incorporated by reference in its entirety.

BACKGROUND

The inventive concept relates generally to semiconductor packages and semiconductor packaging techniques.

In order to meet expanding demands for performance, contemporary and emerging semiconductor devices are often fabricated using system-in-package (SIP) techniques that allow a number of semiconductor chips to be incorporated within a single semiconductor package. However, the resulting semiconductor devices are susceptible to warpage due to differences in coefficients of thermal expansion between different materials and/or components.

SUMMARY

Embodiments of the inventive concept provide semiconductor packages in which warpage is better suppressed across a range of temperatures.

In one embodiment, the inventive concept provides a semiconductor package including: a package substrate, an interposer disposed on the package substrate, a first semiconductor device mounted on the interposer, a second semiconductor device mounted on the interposer adjacent to the first semiconductor device; a molding member disposed on the interposer; and a capping structure disposed on the molding member. The molding member may include; a first molding portion disposed between the first semiconductor device and the second semiconductor device, a second molding portion disposed between the first semiconductor device and the capping structure, and a third molding portion disposed between the capping structure and the interposer substrate.

In another embodiment, the inventive concept provides a semiconductor package including; an interposer mounted on a package substrate, a first semiconductor device and a second semiconductor device mounted on the interposer, a molding member including an outer side wall portion covering an outer side surface of the first semiconductor device, and a lower portion covering at least a portion of an upper surface of the interposer, and a capping structure including an outer side wall portion covering the outer side wall portion of the molding member.

In still another embodiment, the inventive concept provides a semiconductor package including; a package substrate, an interposer substrate disposed on the package substrate, a molding member covering at least a side surface of each of the first semiconductor chip structures and the second semiconductor chip structures on the interposer substrate, and a capping structure disposed on the first and second semiconductor chip structures and the molding member. The capping structure may include; a first capping portion disposed on upper surfaces of the first and second semiconductor chip structures on the interposer substrate, and a second capping portion extending from an edge region of the first capping portion in a direction toward the interposer substrate. A distance from a lower surface of the package substrate to an upper surface of the package substrate may be greater than a distance from an upper surface of the package substrate to upper surfaces of the first and second semiconductor chip structures.

BRIEF DESCRIPTION OF DRAWINGS

Embodiments of the inventive concept may be better understood upon consideration of the following detailed description together with the accompanying drawings, in which.

DETAILED DESCRIPTION

Throughout the written description and drawings, like reference numbers and labels are used to denote like or similar elements and/or features. Drawings are not necessarily drawn to scale and certain elements, features and/or dimensions may be exaggerated for clarity.

Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
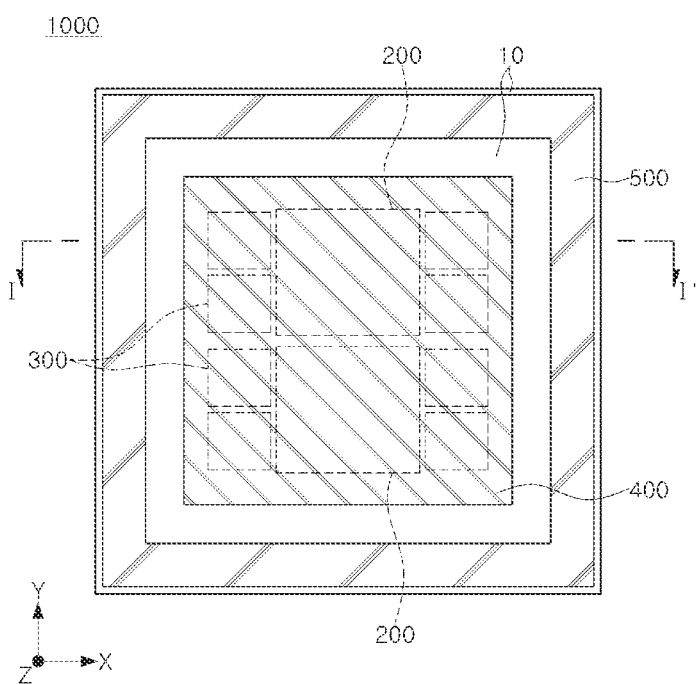
FIG. 1 is a plan view illustrating a semiconductor package according to an embodiment of the inventive concept.
Figure 2:
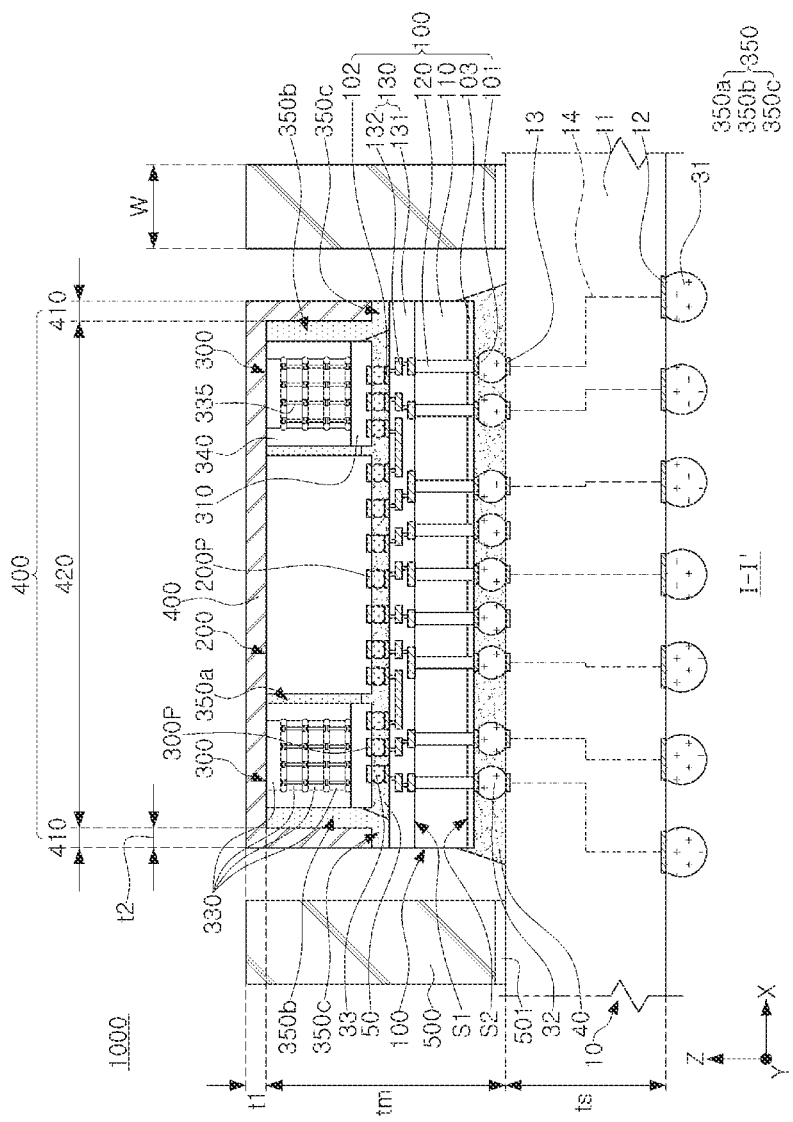
FIG. 2 is a cross-sectional view taken along line I-I' of FIG. 1.

FIG. 1 is a plan (or top-down) view illustrating a semiconductor package 1000 according to an embodiment of the inventive concept, and FIG. 2 is a cross-sectional view taken along line I-I' of FIG. 1.

Referring to FIGS. 1 and 2, the semiconductor package 1000 may include a package substrate 10, an interposer 100, at least one first semiconductor device 300, at least one second semiconductor device 200, a molding member 350, and a capping structure 400. Hereafter, for descriptive clarity, the at least one first semiconductor device 300 may be referred to in the singular ("first semiconductor device"), and the at least one second semiconductor device 200 may be referred to in the singular ("second semiconductor device").

In some embodiments, the semiconductor package 1000 may further include a stiffener 500.

The package substrate 10 may include a body 11, lower pads 12 disposed on a lower surface of the body 11, upper pads 13 disposed on an upper surface of the body 11, and lower interconnection structure 14 variously interconnecting respective lower pads 12 with one or more upper pads 13. The package substrate 10 may be variously configured as a support substrate for the interposer 100, as well as related and structures. For example, the first semiconductor device 300 and the second semiconductor device 200 may be mounted (e.g., mechanically assembled and/or electrically connected) on the interposer 100. The package substrate 10 may include a printed circuit board (PCB), a ceramic substrate, a glass substrate, a tape interconnection substrate, etc. That is, the body 11 of the package substrate 10 may include one or more material(s) depending on the constituent type of the substrate. For example, when the package substrate 10 may include PCB and one or more interconnection layer(s) stacked on one surface or both surfaces of the PCB (e.g., a body copper clad laminate, a copper clad laminate, etc.).

In some embodiments, a solder resist layer may be formed on the lower surface and/or the upper surface of the package substrate 10.

In some embodiments, a first thickness ('ts') of the package substrate 10 (e.g., as measured between the lower surface of the package substrate 10 and the upper surface of the package substrate 10) may be greater than a second thickness ('tm') of components mounted on the package substrate 10 (e.g., as measured between the upper surface of the package substrate 10 and co-planar upper surfaces of the first and second semiconductor devices 300 and 200). (In this regard, a "thickness" may be understood as a distance measured in a vertical (or Z) direction from an arbitrary horizontal plane).

The first thickness ts of the package substrate 10 may be greater than a thickness of the interposer 100. The first thickness ts of the package substrate 10 may range from about 1 mm to about 2.5 mm. The second thickness tm of the components mounted on the package substrate 10 may range from about 0.5 mm to about 1.5 mm, for example.

The lower pads 12 and the upper pads 13 as well as the lower interconnection structure 14 may form various electrical path(s) between the lower surface and the upper surface of the package substrate 10. The lower pads 12, the upper pads 13 and the lower interconnection structure 14 may be include at least one of, for example, copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C). The lower interconnection structure 14 may include one or more interconnection layers and/or via(s) respectively connecting respective interconnection layers.

First connection bumps 31 may be respectively connected to the lower pads 12 on the lower surface of the package substrate 10. The first connection bumps 31 may include at least one of, of example, tin (Sn), indium (In), bismuth (Bi), antimony (Sb), copper (Cu), silver (Ag), zinc (Zn) and lead (Pb). In some embodiments, each of the first connection bumps 31 may have a spherical (or ball) shape and may include an alloy including tin (e.g., Sn—Ag—Cu).

The interposer 100 may be configured as a support substrate for at least the first semiconductor device 300 and the second semiconductor device 200. In some embodiments, the interposer 100 may include a base substrate 110, one or more through via(s) 120, and an interconnection layer 130. In some embodiments, the interposer 100 may be a silicon interposer substrate including through silicon via(s) (TSV).

Alternately or additionally, the interposer 100 may be configured as a redistribution substrate. In this regard, the interposer 100 may include lower pads 101 disposed on a lower surface (S1) of the interposer 100 and upper pads 102 disposed on an upper surface (S2) of the interposer 100.

The base substrate 110 may include one or more semiconductor material(s) such as silicon (Si), germanium (Ge), silicon carbide (SiC), gallium arsenide (GaAs), indium arsenide (InAs), indium phosphide (InP), etc. A protective layer 103 may be formed on the lower surface of the base substrate 110 and may include a silicon oxide film, a silicon nitride film, and/or a silicon oxynitride film. In some embodiments, the protective layer 103 may include a polymer, such as polyimide (PI). Although not shown in FIG. 2, the protective layer 103 may optionally be formed on the upper surface of the interconnection layer 130.

The through via(s) 120 (e.g., through silicon via (TSVs)) may be variously configured and may penetrate the thickness of the base substrate 110. Thus, the through via(s) 120 may form at least part of electrical paths variously connecting respective lower pads 101 with the upper pads 102 of the interposer 100. In this manner, the through via(s) 120 may electrically connect elements of the interconnection layer 130 with the lower interconnection structure 14 and first interconnection bumps 31 of the package substrate 10.

Each of the through via(s) 120 may include a conductive plug and a barrier layer substantially surrounding the conductive plug. The conductive plug may include at least one of, for example, tungsten (W), titanium (Ti), aluminum (Al), and copper (Cu). The conductive plug may be formed using a plating process, a Physical Vapor Deposition (PVD) process, and/or a Chemical Vapor Deposition (CVD) process. The barrier film may include an insulating barrier film and/or a conductive barrier film. The insulating barrier film may include at least one of, for example, an oxide film, a nitride film, a carbide film and a polymer. A conductive barrier film may be disposed between the insulating barrier film and the conductive plug. The conductive barrier layer may include at least one of, for example, tungsten nitride (WN), titanium nitride (TiN), and tantalum nitride (TaN). The barrier film may be formed using a PVD process and/or a CVD process.

The interconnection layer 130 may be disposed the upper surface (or front side) of the base substrate 110, and may generally include an interlayer insulating layer 131 and an upper interconnection structure 132. The interlayer insulating layer 131 may be disposed on the upper surface of the base substrate 110 and may include silicon oxide and/or silicon nitride. The upper interconnection structure 132 may be used to variously interconnect the first semiconductor device 300 and the second semiconductor device 200. Further, the upper interconnection structure 132 may be used to interconnect the first semiconductor device 300 and the second semiconductor device 200 with components of the package substrate 10, as well as components of the interposer 100. The upper interconnection structure 132 may include one or more layers of horizontal interconnection(s) and vertical contact via(s). Here, each of the contact via(s) and interconnection(s) may include one or more conductive material(s). Here, the interconnections and/or the contact via(s) may variously connect the upper pad(s) 102 with the through via(s) 120.

The lower pads 101 of the interposer 100 may be respectively connected with one or more second connection bumps 32, and the upper pads 102 of the interposer 100 may be respectively connected with one or more of third connection bumps 33. Here, the lower pads 101 and the upper pads 102 of the interposer 100 may be formed of at least one of, for example, copper (Cu), aluminum (Al), nickel (Ni), silver (Ag), or gold (Au), platinum (Pt), tin (Sn), lead (Pb), titanium (Ti), chromium (Cr), palladium (Pd), indium (In), zinc (Zn), and carbon (C).

The second connection bumps 32 connected to the lower pads 101 may be disposed on the lower surface of the interposer 100 (e.g., the lower surface of the base substrate 10). Thus, the second connection bumps 32 may connect the through via(s) 120 of the interposer 100 with the lower interconnection structure 14 of the package substrate 10.

The third connection bumps 33 may be disposed on respective lower surfaces of the first semiconductor device 300 and the second semiconductor device 200. Thus, the third connection bumps 33 may variously connect the first semiconductor device 300 and the second semiconductor device 200 with the interposer 100. Each of the second and third connection bumps 32 and 33 may include at least one of, for example, tin (Sn), indium (In), bismuth (Bi), antimony (Sb), copper (Cu), silver (Ag), zinc (Zn) and lead (Pb). In some embodiments, the second and third connection bumps 32 and 33 may have a spherical (or ball) shape and include an alloy including tin (e.g., Sn—Ag—Cu). The first, second and third connection bumps 31, 32, and 33 may have different sizes. That is, in some embodiments, the first connection bump 31 may be larger than the second and third connection bumps 32 and 33, and the second connection bump 32 may be larger than the third connection bump 33.

In some embodiments, the first semiconductor device 300 may be a single semiconductor chip, and/or the second semiconductor device 200 may be a single semiconductor chip. Alternately, one or both of the first semiconductor device 300 and the second semiconductor device 200 may include a number of semiconductor chips (e.g., a vertically stacked plurality of chips).

In FIG. 1, four (4) first semiconductor devices 300 are illustrated, but the inventive concept is not limited thereto.

Each of the first semiconductor devices 300 may be disposed adjacent to at least one of the second semiconductor devices 200, and may include first pads 300P. In some embodiments, the first semiconductor device 300 may include a base chip 310 and stacked semiconductor chips 330. The number (e.g., 2, 3, 4 or 5) of the stacked semiconductor chips 330 may vary by design. The base chip 310 may include one or more semiconductor material(s) (e.g., silicon (Si)) and may further include TSVs. Alternately, the base chip 310 may include a PCB or a glass substrate.

Here, the base chip 310 may be configured as a buffer die receiving at least one control signal(s), address signal(s), data signal(s), power signal(s), and/or ground signal(s) related to the operation of the stacked semiconductor chips 330. The foregoing signal(s) may be externally provided and/or internally generated by the stacked semiconductor chips 330 and/or the second semiconductor device 200.

The stacked semiconductor chips 330 disposed on the base chip 310 may be variously interconnected by through the TSV 335 penetrating one or more of the stacked semiconductor chips 330. The stacked semiconductor chips 330 may include a volatile memory device (e.g., a Dynamic Random Access Memory (RAM) (DRAM) and/a static RAM (SRAM), and/or a nonvolatile memory device (e.g., a Phase-change RAM (PRAM), a magnetic RAM (MRAM), a resistance RAM (RRAM), and/or a flash memory device). Thus, the stacked semiconductor chips 330 may store or output data in response to signals provided by the base chip 310.

Conductive bumps and an insulating film surrounding the conductive bumps may be disposed between respective ones of the stacked semiconductor chips 330.

Additionally, in some embodiments, the stacked semiconductor chips may be substantially surrounded by the molding member 340. The molding member 340 may include one or more insulating resin(s), such as for example, prepreg, an Ajinomoto build-up film (ABF), FR-4, bismaleimide triazine (BT), and epoxy molding compound (EMC).

From the foregoing it will be appreciated that the first semiconductor device 300 may be configured as a memory device including one or more memory chip(s). For example, the first semiconductor device 300 may be a volatile memory device and/or a nonvolatile memory device. In some embodiments, the first semiconductor device 300 may be a high-performance memory device, such as a high bandwidth memory (HBM) or a hybrid memory cubic (HMC).

The second semiconductor device(s) 200 may be electrically interconnected with the first semiconductor device(s) 300 through second pads 200P and the interconnection layer 130 of the interposer 100. In FIG. 1, two (2) second semiconductor devices 200 are illustrated, but the inventive concept is not limited thereto. The second semiconductor chip structure 200 may include at least one of, for example, a central processor (CPU), a graphic processor (GPU), a field programmable gate array (FPGA), a digital signal processor (DSP), a cryptographic processor, a microprocessor, a microcontroller, an analog-to-digital converter, and a logic chip such as an application-specific IC (ASIC). In some embodiments, the second semiconductor chip structure 200 may be configured as a high performance semiconductor chip occupying a relatively large lateral area analogous to certain logic chips.

The molding member 350 may seal at least a portion of the first and second semiconductor devices 300 and 200 on the interposer 100. The molding member 350 may cover at least side surfaces of the first and second semiconductor devices 300 and 200. In this regard, in some embodiment, the side surface of the molding member 350, the side surface of the interposer 100, and the side surface of the capping structure 400 may be substantially coplanar. That is, the side surface of the molding member 350, the side surface of the interposer 100, and the side surface of the capping structure 400 may be vertically aligned. In some embodiments, a portion of the side surface of the molding member 350 may be covered by the capping structure 400.

In some embodiments, the shape of the molding member 350 may be characterized by a "bent edge portion" proximate to an edge region of the interposer 100. The provision of the molding member 350 including the bent edge portion allows the molding member 350 may include upper surfaces disposed at different levels.

In the illustrated example of FIG. 2, the molding member 350 may include a first molding portion 350a vertically disposed between opposing side surfaces of the first and second semiconductor devices 300 and 200; a second molding portion 350b substantially vertically disposed between opposing the side surfaces of the first semiconductor device 300 and the capping structure 400; and a third molding portion 350c substantially horizontally disposed between a lower surface of the capping structure 400 and the upper surface of the interposer 100, wherein the bent edge portion of the molding member 350 is formed by a "corner combination" of the vertically-descending, second molding portion 350b and the horizontally-extending, third molding portion 350c.

Upper surfaces of the first molding portion 350a and the second molding portion 350b may be substantially coplanar. Further, the upper surface of the first molding portion 350a may be substantially coplanar with the upper surface of the second semiconductor device 200 and the upper surface of the first semiconductor device 300, and the upper surface of the second molding portion 350b may be substantially coplanar with the upper surface of the second semiconductor device 200 and the upper surface of the first semiconductor device 300.

In contrast, an upper surface of the third molding portion 350c may be lower than the upper surfaces of the first molding portion 350a, the second molding portion 350b, the first semiconductor device 300 and the second semiconductor device 200. In some embodiments, the upper surface of the third molding portion 350c may be substantially coplanar with the respective lower surfaces of the first and second semiconductor devices 300 and 200. However, in other embodiments, the upper surface of the third molding portion 350c may be lower or higher than the lower surfaces of the first and second semiconductor devices 300 and 200.

In some embodiments, the upper surfaces of the first molding portion 350a, the second molding portion 350b, and the third molding portion 350c may be covered by the capping structure 400. In some embodiments, the upper surfaces of the first molding portion 350a and the second molding portion 350b may directly contact a lower horizontal surface of the capping structure 400. At least a portion of a vertically descending side surface of the second molding portion 350b may be covered by the capping structure 400, whereas a side surface of the third molding portion 350c may be exposed in relation to the capping structure 400. That is, an outward-facing (or outer) side surface of the third molding portion 350c is not covered by the capping structure 400. Accordingly, in some embodiments, the outer side surface of the third molding portion 350c, an outer side surface of the interposer 100, and an outer side surface of the capping structure 400 may be substantially coplanar.

The molding member 350 may include, for example, a thermosetting resin such as an epoxy resin, a thermoplastic resin such as polyimide, or prepreg, Ajinomoto build-up film (ABF), FR-4, bismaleimide triazine (BT), and epoxy molding compound (EMC), including an inorganic filler and/and glass fiber.

The capping structure 400 may be disposed on the molding member 350 in order to inhibit warpage of the semiconductor package 1000. The capping structure 400 may further serve as a heat dissipation structure that exhausts and/or dissipates heat generated in the first and second semiconductor devices 300 and 200. In this regard, the capping structure 400 may cover upper surfaces of the first and second semiconductor devices 300 and 200. In some embodiments, the capping structure 400 may also cover the entire upper surface of the molding member 350 (e.g., upper surfaces of the first molding portion 350a and the second molding portion 350b). In some embodiments, at least a portion of the outer side surface of the molding member 350 may be covered by the capping structure 400.

In some embodiments, the capping structure 400 may include a first capping portion 420 disposed on the upper surfaces of the first and second semiconductor devices 300 and 200, and a second capping portion 410 vertically descending from an edge portion of the first capping portion 420 towards the interposer 100. That is, the first capping portion 420 may be disposed on upper surfaces of the first and second semiconductor devices 300 and 200, the first molding portion 350a, and the second molding portion 350b, whereas the second capping portion 410 may be disposed on an upper surface of the third molding portion 350c at a different level. The second capping portion 410 may directly contact the upper surface of the third molding portion 350c. The second capping portion 410 may cover a side surface of the second molding portion 350b.

In some embodiments including the stiffener 500, the outer side surface of the second capping portion 410 may oppose an inward-facing (or inner) side surface of the stiffener 500. Hence, the side surface of the second capping portion 410, side surface of the third molding portion 350c, and side surface of the interposer 100 may be substantially coplanar.

In FIG. 2, the lower surface of the second capping portion 410 is shown as being disposed at substantially the same level as the lower surfaces of the first and second semiconductor devices 300 and 200, but the inventive concept is not limited thereto. For example, a lower surface of the second capping portion 410 may be disposed higher or lower than the lower surfaces of the first and second semiconductor devices 300 and 200.

The capping structure 400 may include at least one material having a coefficient of thermal expansion (CoTE) that is higher than the (CoTE) of the package substrate 10. The capping structure 400 may include at least one conductive material, such as for example, copper (Cu) and steel use stainless (SUS).

A third thickness ("t1") of the first capping portion 420 of the capping structure 400 may range from about 0.05 mm to about 0.3 mm, for example. In this regard, the third thickness t1 may be less than a first width W of the stiffener 400 (wherein "width" is measured in the first horizontal or X direction perpendicular to the vertical direction). By comparison, the first width W of the stiffener 500 may range from about 6 mm to about 10 mm, for example.

A second width ("t2") of the second capping portion 410 may range from about 0.1 mm to about 0.5 mm, for example. Experiments with variations in the third thickness t1 and the second width t2 have shown that third thicknesses and/or second width less than the foregoing ranges adversely affect the ability of the capping structure 400 to suppress warpage in the semiconductor package 1000.

In some embodiments, the stiffener 500 may be additionally disposed on the package substrate 10 to suppress warpage of the semiconductor package 1000. The stiffener 500 may be disposed to continuously or discretely (e.g., in piece parts) surround side surface(s) of the interposer 100. In this regard, the stiffener 500 may be horizontally (or laterally) spaced apart from the capping structure 400. The stiffener 500 may be include at least one of, for example, aluminum (Al), silver (Ag), tin (Sn), gold (Au), nickel (Ni), lead (Pb) and titanium (Ti).

Further in this regard, the semiconductor package 1000 may include an adhesive layer 501 between the stiffener 500 and the upper surface of the package substrate 10. For example, the stiffener 500 may be attached to the upper surface of the base substrate 10 using the adhesive layer 501 (e.g., a thermally conductive adhesive tape, thermally conductive grease, thermally conductive adhesive, etc.).

The semiconductor device 1000 may optionally include a first underfill resin 40 substantially surrounding the second connection bumps 32 between the package substrate 10 and the interposer 100, and/or a second underfill resin 50 substantially surrounding the third connection bumps 33 between the interposer 100 and the first and second semiconductor devices 300 and 200. The first and second underfill resins 40 and 50 may be formed of, for example, an epoxy resin.

In some embodiments, the second underfill resin 50 may be a portion of the molding member 350 formed by a molded under-fill (MUF) method.

Thus, with reference to the illustrated embodiment of FIGS. 1 and 2, the semiconductor package 1000 may include the interposer 100 mounted on the package substrate 10, wherein the first semiconductor device 300 and the second semiconductor device 200 are mounted on the interposer. The molding member 350 may include an outer side wall portion (e.g., 350b) covering an outer side surface of the first semiconductor device 300, and a lower portion (e.g., 350c) covering at least a portion of an upper surface of the interposer. The capping structure 400 may include an outer side wall portion covering the outer side wall portion of the molding member 350. The molding member 350 may further include an inner side wall portion (e.g., 350a) filling a space (or gap) between the first semiconductor device 300 and the second semiconductor device 200.

Thus, the capping structure 400 may further includes a top portion covering an upper surface of the outer side wall portion of the molding member 350 and an upper surface of the inner side wall portion of the molding member 350.

FIGS. 3 to 8 are cross-sectional views illustrating various semiconductor devices according to embodiments of the inventive concept. Each of FIGS. 3 to 8 may be understood a cross-sectional view of a different embodiment of the inventive concept taken along I-I' of FIG. 1. The following descriptions are presented in the context of FIGS. 1 and 2, and only material differences between the embodiments of FIGS. 3 to 8 and the embodiment of FIG. 2 are highlighted.

Figure 3:
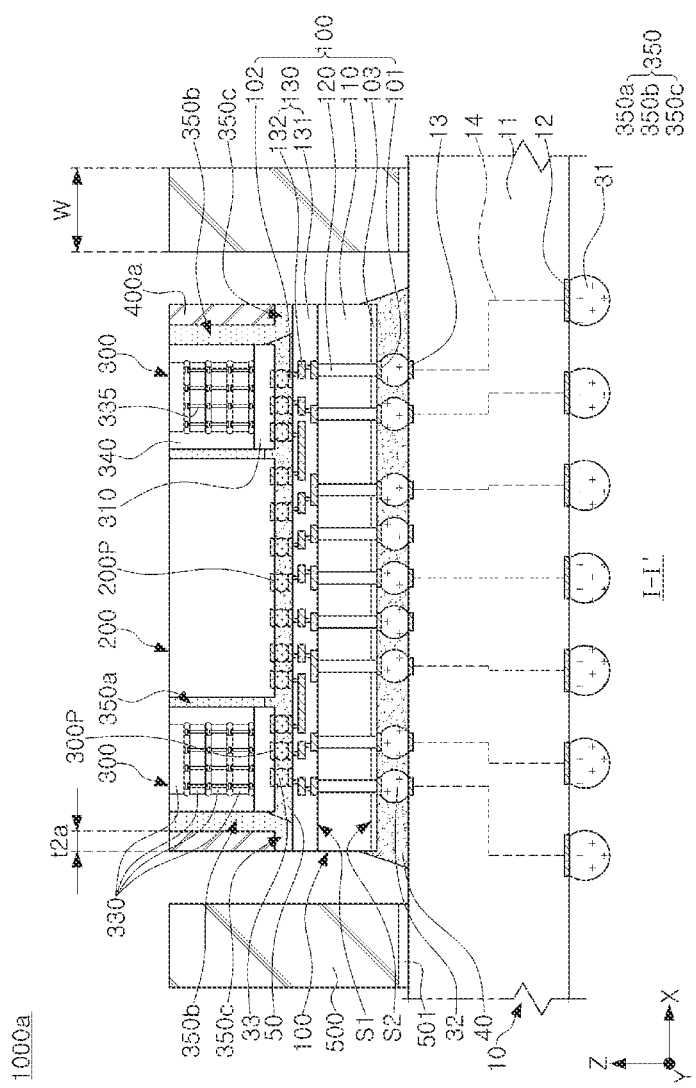
FIGS. 3, 4, 5, 6, 7 and 8 (hereafter collectively, "FIGS. 3 to 8") are respective cross-sectional view illustrating various semiconductor packages according to embodiments of the inventive concept.

Referring to FIG. 3, in a semiconductor package 1000a, a capping structure 400a omits the first capping portion 420 of capping structure 400 that covers the upper surfaces of the first and second semiconductor devices 300 and 200. Instead, the capping structure 400a may be disposed on side surfaces of the second molding portion 350b and on the upper surface of the third molding portion 350c.

Hence, an upper surface of the capping structure 400a may be substantially coplanar with the upper surface of the molding member 350. And in some embodiments, the upper surface of the capping structure 400a may be substantially coplanar with the upper surfaces of the first and second semiconductor devise 300 and 200. Alternately, the upper surface of the capping structure 400a may be lower than the upper surfaces of the first and second semiconductor devices 300 and 200.

The second width t2a of the capping structure 400a may range from about 0.05 mm to about 0.5 mm, which is less than the first width W of the stiffener 500.

Figure 4:
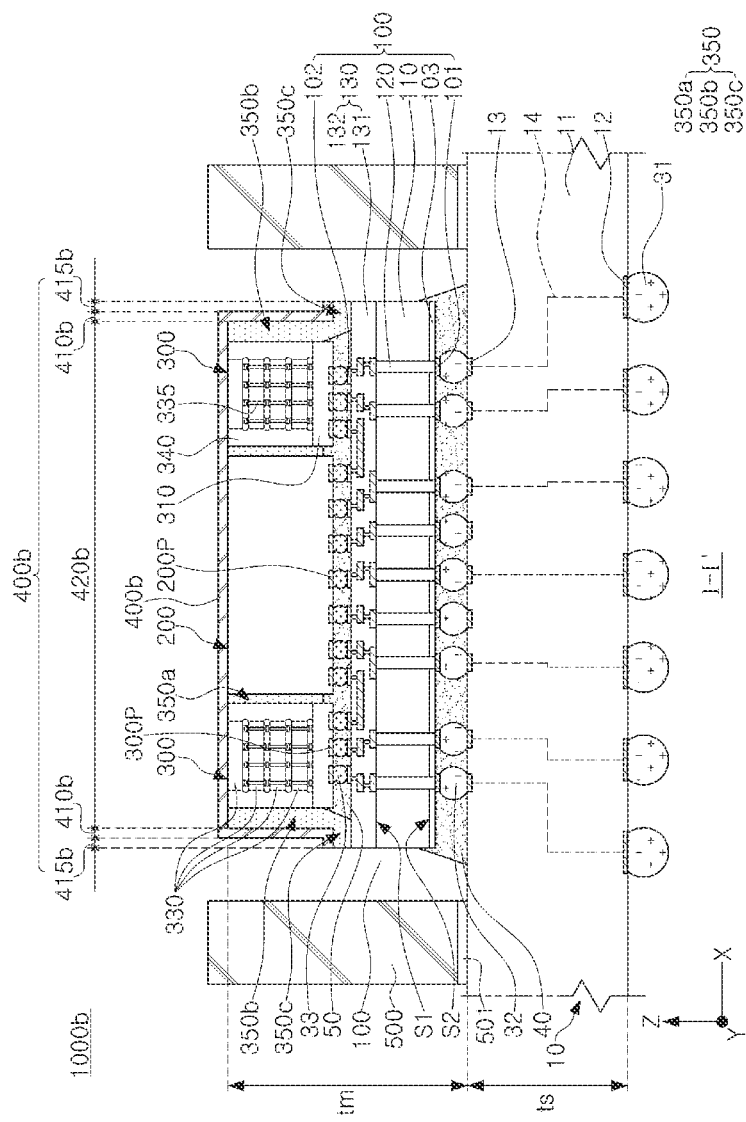

Referring to FIG. 4, in a semiconductor package 1000b, a capping structure 400b may further include a bent portion proximate an edge region of the molding member 350.

Here, the capping structure 400b may cover upper surfaces of the first and second semiconductor devices 300 and 200, and upper surfaces of the molding member 350. That is, the capping structure 400b may cover upper surfaces of the first molding portion 350a, the second molding portion 350b, and the third molding portion 350c.

In some embodiments, the capping structure 400b may include portions covering upper surfaces disposed on different levels. In some embodiments, the capping structure 400b may include a first capping portion 420b disposed on upper surfaces of the first and second semiconductor devices 300 and 200, a second capping portion 410b extending from an edge of the first capping portion 420b towards the interposer 100, and a third capping portion 415b horizontally extending from the second capping portion 410b along the upper surface of the third molding portion 350c.

Hence, the first capping portion 420b may be disposed on upper surfaces of the first and second semiconductor devices 300 and 200, the upper surface of the first molding portion 350a, and the upper surface of the second molding portion 350b. The second capping portion 410b may be disposed on a side surface of the second molding portion 350b. The second capping portion 410b may contact the side surface of the second molding portion 350b. In some embodiments, the capping structure 400b may include a bent portion including a combination of part of the second capping portion 410b and part of the third capping portion 415b. The third capping portion 415b may be disposed on the upper surface of the third molding portion 350c and may cover the upper surface of the third molding portion 350c. In some embodiments, an upper surface of the first capping portion 420b may be disposed higher than an upper surface of the third capping portion 415b.

The side surface of the second capping portion 410b and the side surface of the third capping portion 415b may oppose the inner side surface of the stiffener 500. The side surface of the third capping portion 415b, the side surface of the third molding portion 350c of the molding member 350, and the side surface of the interposer 100 may be substantially coplanar.

Thus, with reference to FIGS. 1, 2 and 4, the semiconductor package 1000b may include a capping structure 400b that further includes a lip portion laterally extending from the side wall portion (e.g., 410b) of the capping structure 400b over the lower portion surface of the molding member 350 covering a portion of the upper surface of the interposer 100.

Figure 5:
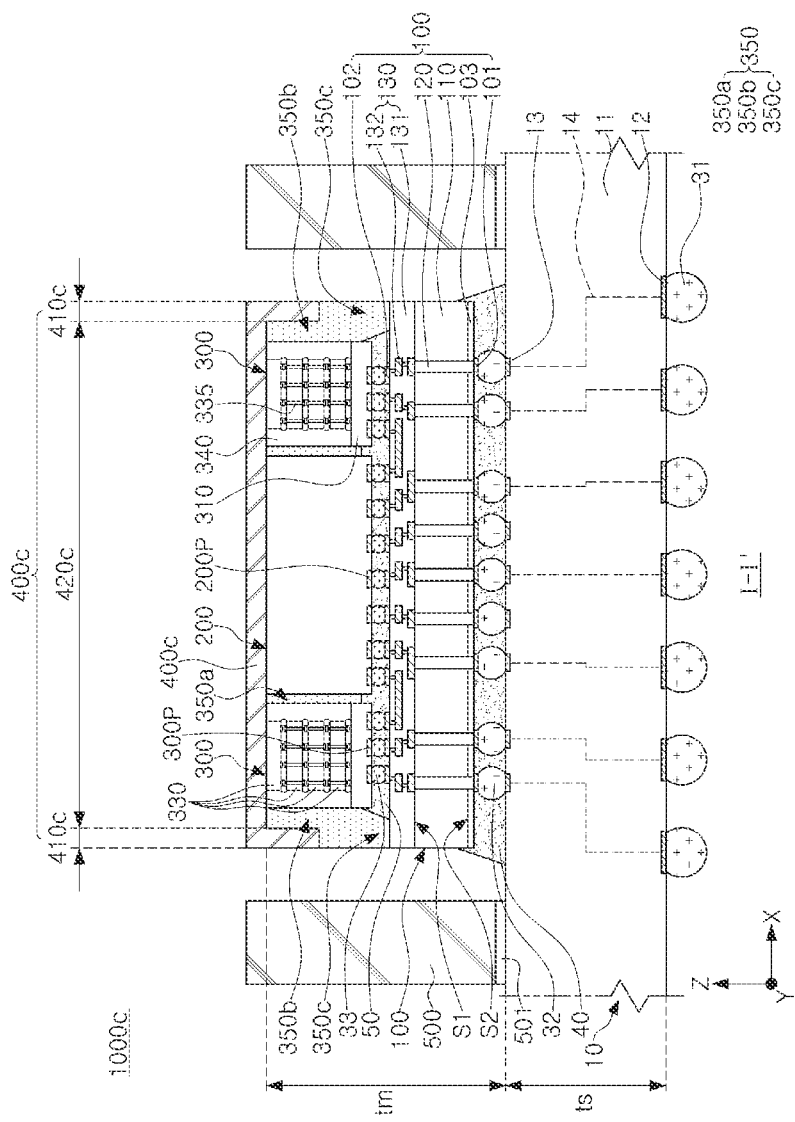

Referring to FIG. 5, in a semiconductor package 1000c, the upper surface of the third molding portion 350c of the molding member 350 may be disposed higher than a level of the lower surfaces of the first and second semiconductor devices 300 and 200. The capping structure 400c may include a first capping portion 420c disposed on the upper surfaces of the first and second semiconductor devices 300 and 200, and a second capping portion 410c extending from an edge region of the first capping portion 420c toward the interposer 100. A lower surface of the second capping portion 410c may be disposed higher than the upper surfaces of the first and second semiconductor devices 300 and 200.

Figure 6:
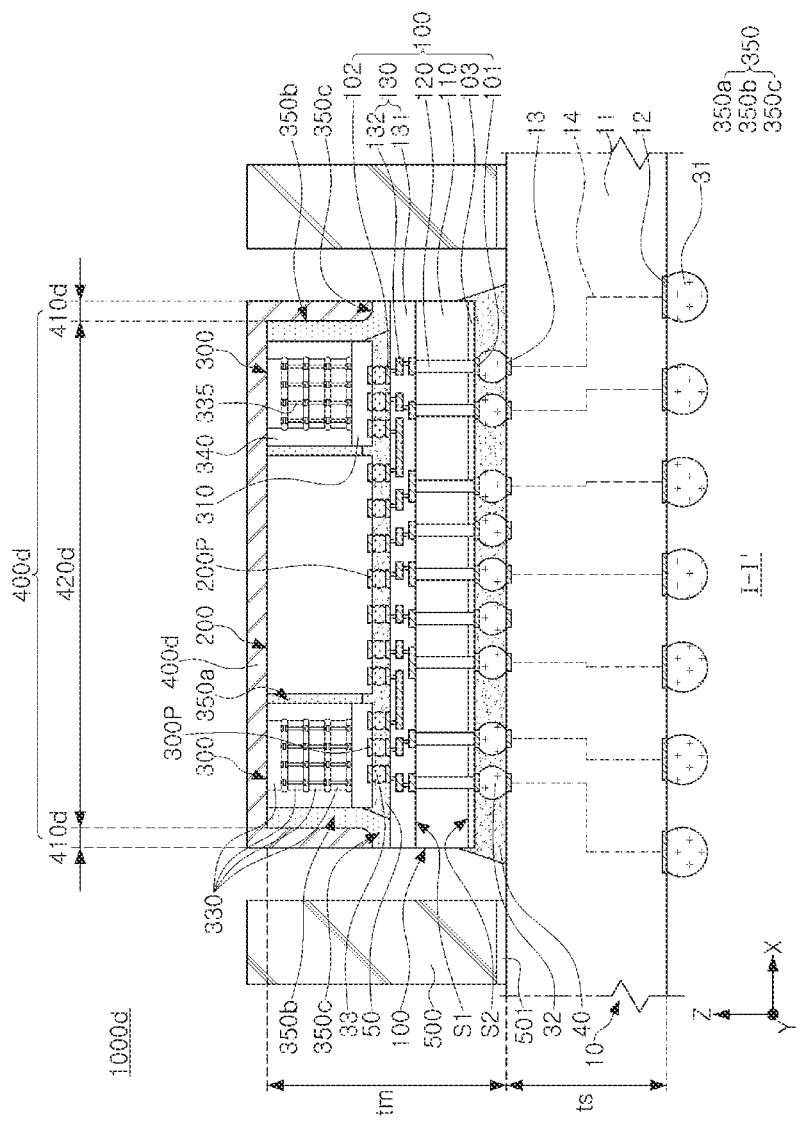

Referring to FIG. 6, in the semiconductor package 1000d, the molding member 350 may include a curved or rounded bent portion proximate an edge region on the interposer 100. Here, the molding member 350 may include the first molding portion 350a disposed between the first and second semiconductor devices 300 and 200, the second molding portion 350b disposed between side surfaces of the first semiconductor devices 300 and the capping structure 400, and the third molding portion 350c disposed between the capping structure 400 and the interposer 100. The molding member 350 may include the curved bent portion disposed between the second molding portion 350b and the third molding portion 350c.

The capping structure 400d may include a first capping portion 420d disposed on upper surfaces of the first and second semiconductor devices 300 and 200, and a second capping portion 410d extending from an edge region of the first capping portion 420d toward the interpose substrate 100 and having a curved lower surface.

Figure 7:
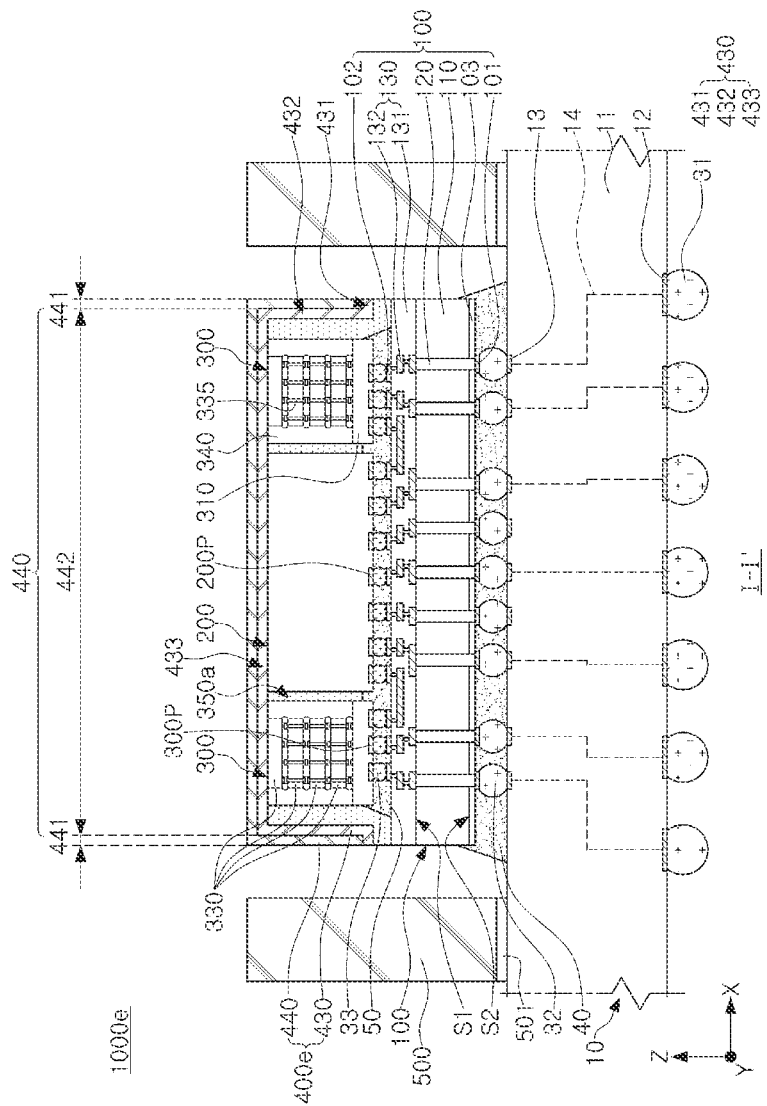

Referring to FIG. 7, in a semiconductor package 1000e, a capping structure 400e may include multiple capping layers 430 and 440. For example, the capping structure 400e may include a first capping layer 430 on the molding member 350 and a second capping layer 440 stacked on the first capping layer 430. In some embodiments, the first capping layer 430 may include portions having upper surfaces disposed on different levels. In some embodiments, the first capping layer 430 may include a first portion 433 disposed on the upper surfaces of the first and second semiconductor devices 300 and 200, a second portion 432 extending from an edge region of the first portion 433 toward the interposer 100, and a third portion 431 extending from the second portion 432 in the x direction along the upper surface of the third molding portion 350c.

The first portion 433 of the first capping layer 430 may be disposed on the upper surfaces of the first and second semiconductor devices 300 and 200, the upper surfaces of the first molding portion 350a, and the upper surface of the second molding portion 350b. The second portion 432 of the first capping layer 430 may be disposed on a side surface of the second molding portion 350b. The second portion 432 of the first capping layer 430 may cover and in contact with the side surface of the second molding portion 350b. In some embodiments, the first capping layer 430 may include a bent portion. In some embodiments, the first capping layer 430 may include a bent portion disposed between the second portion 432 and the third portion 431. The third portion 431 of the first capping layer 430 may be disposed on the upper surface of the third molding portion 350c and may cover the upper surface of the third molding portion 350c. In some embodiments, an upper surface of the first portion 433 of the first capping layer 430 may be disposed higher than an upper surface of the third portion 431.

The second capping layer 440 may cover an upper surface of each of the first portion 433, the second portion 432, and the third portion 431 of the first capping layer 430.

In some embodiments, the second capping layer 440 may include a first portion 442 disposed on an upper surface of the first portion 433 of the first capping layer 430, and a second portion 441 extending from an edge region of the first portion 442 toward the interposer 100. The first portion 442 of the second capping layer 440 may be disposed on upper surfaces of the first and second portions 433 and 432 of the first capping layer 430, and the second portion 441 of the second capping layer 440 may cover and in contact with an upper surface of the third portion 431 of the capping layer 440. A side surface of the second capping layer 430 may oppose a side surface of the stiffener 500. A side surface of the second portion 441 of the second capping layer 430 may oppose a side surface of the stiffener 500.

The side surface of the capping structure 400e, the side surface of the molding member 350, and the side surface of the interposer 100 may be substantially coplanar. A side surface of each of the first capping layer 430, the second capping layer 440, the molding member 350, and the interposer 100 may be substantially coplanar. Side surfaces of the third portion 431 of the first capping layer 430, the second portion 441 of the second capping layer 440, the third molding portion 350c of the molding member 350, and the interposer 100 may be substantially coplanar.

In some embodiments, the first capping layer 430 and the second capping layer 440 may include different materials having a relatively higher coefficient of thermal expansion than that of the package substrate 10. Each of the first capping layer 430 and the second capping layer 440 may include at least one of, for example, copper (Cu) and steel use stainless (SUS), but the inventive concept is not limited thereto. In another embodiment, the first capping layer 430 may include a non-metal material, and the second capping layer 440 may include a metal material.

Figure 8:
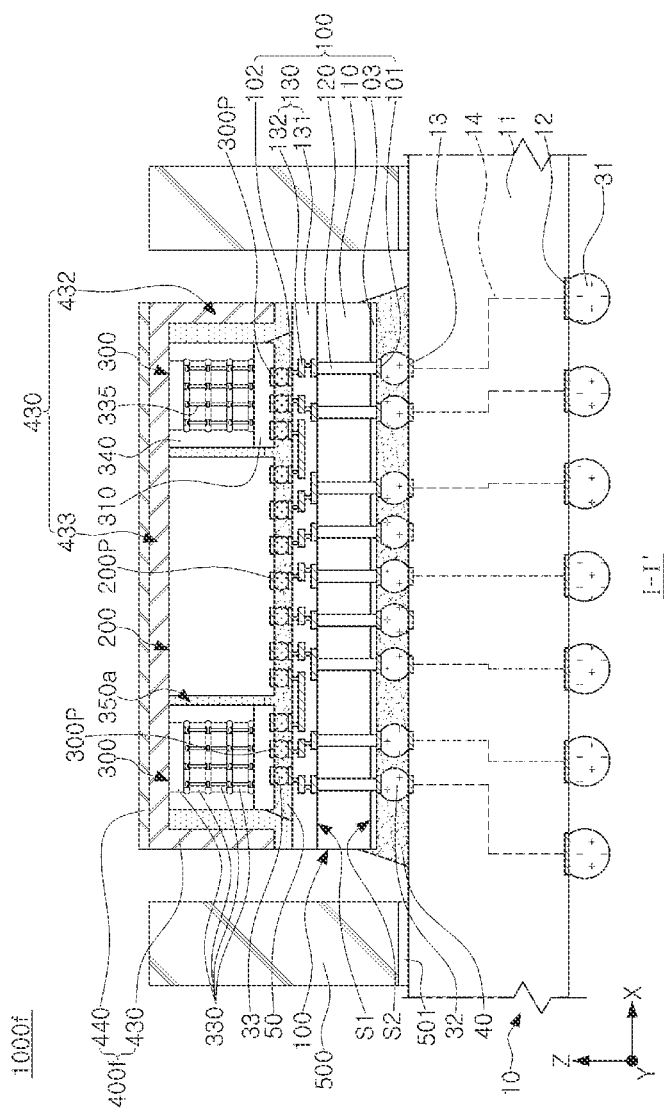

Referring to FIG. 8, a capping structure 400f in a semiconductor package 1000f may include multiple capping layers 430 and 440.

The capping structure 400f may include a first capping layer 430 on the molding layer 350 and a second capping layer 440 stacked on the first capping layer 430. In some embodiments, the first capping layer 430 may include a first portion 433 disposed on the upper surfaces of the first and second semiconductor devices 300 and 200, and a second portion 432 extending from an edge region of the first portion 433 toward the interposer 100.

The first portion 433 of the first capping layer 430 may cover upper surfaces of the first and second semiconductor devices 300 and 200, upper surfaces of the first molding portion 350a, and an upper surface of the second molding portion 350b. The second portion 432 of the first capping layer 430 may be disposed on a side surface of the second molding portion 350b. The second portion 432 of the first capping layer 430 may cover and in contact with the side surface of the second molding portion 350b. The second portion 432 of the first capping layer 430 may be disposed on the upper surface of the third molding portion 350c and may cover the upper surface of the third molding portion 350c.

The second capping layer 440 may have a lower surface disposed on substantially the same level in a region in which the first portion 433 of the first capping layer 430 is disposed and a region in which the second portion 432 of the first capping layer 43 is disposed.

In some embodiment, a thickness of the first capping layer 430 may be greater than a thickness of the second capping layer 440, or the thickness of the capping layer 430 may be less than the thickness of the second capping layer 440.

Figure 9:
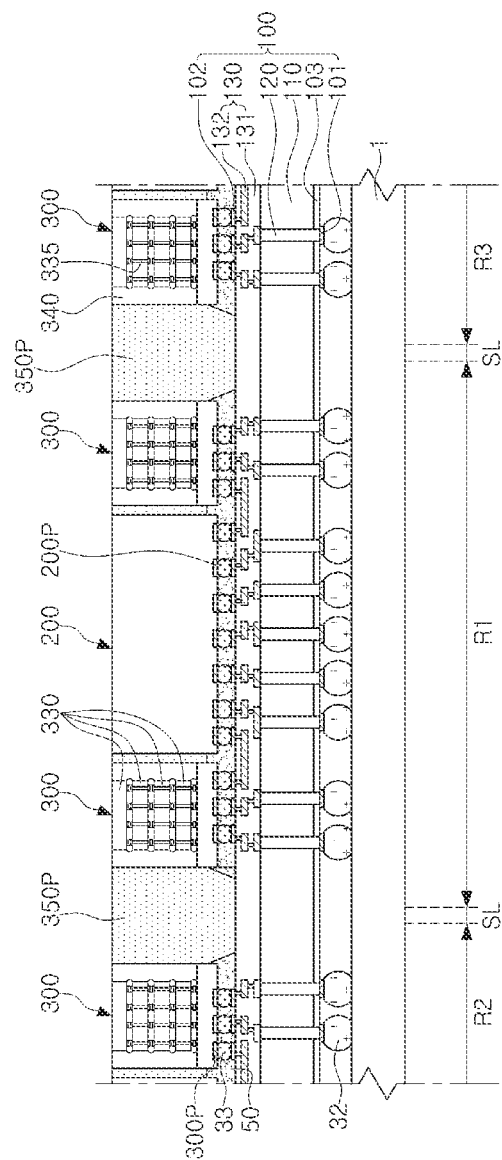
FIGS. 9, 10 and 11 are related cross-sectional views illustrating a method of manufacturing a semiconductor package according to embodiments of the inventive concept.
Figure 10:
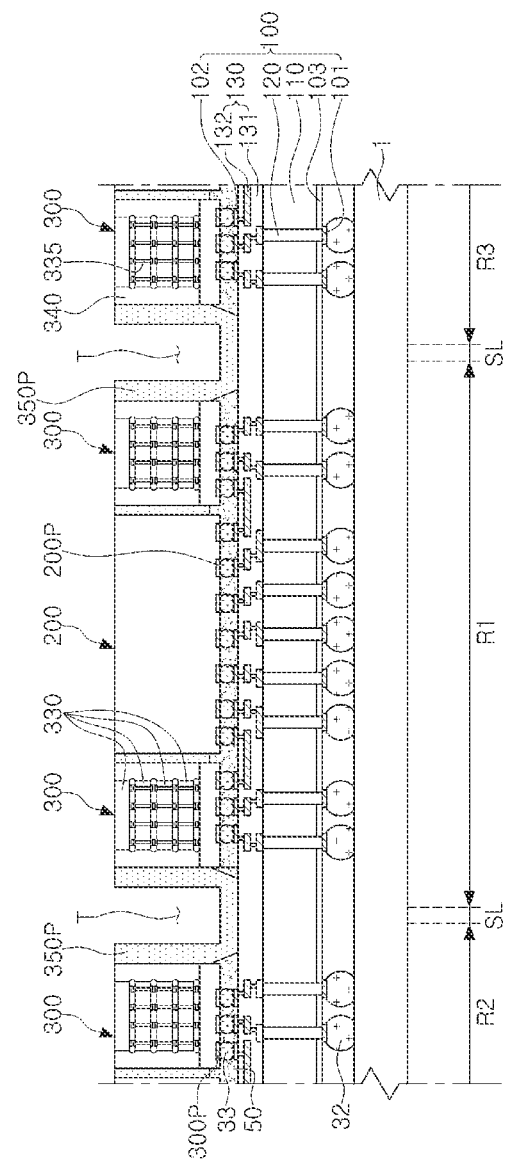
Figure 11:
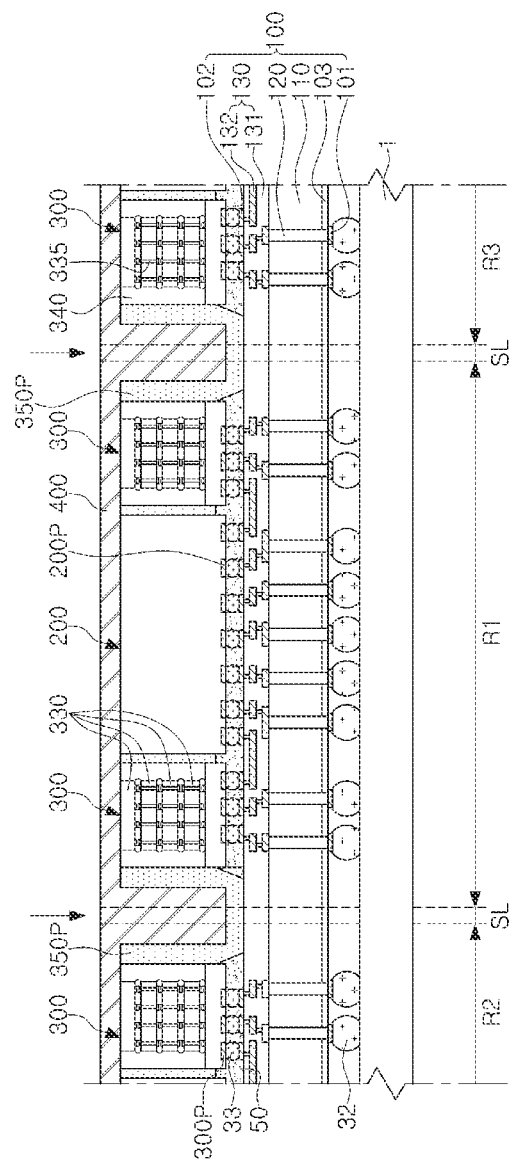

FIGS. 9, 10 and 11 are related cross-sectional views illustrating in one example a method of manufacturing a semiconductor package according to embodiments of the inventive concept.

Referring to FIG. 9, the first and second semiconductor devices 300 and 200 may be mounted on the interposer 100. Thereafter, the interposer 100 may be attached to a carrier 1. The interposer 100 may include package regions R1, R2, and R3 divided by scribe lane regions SL, which may be a first package region R1, a second package region R2, and a third package region R3, for example. Thereafter, a preliminary molding member 350P covering at least side surfaces of the first and second semiconductor devices 300 and 200 may be formed on the interposer 100. The preliminary molding member 350P may be formed to cover the side surfaces and upper surfaces of the first and second semiconductor devices 300 and 200, and a grinding process or a planarization process may be performed such that the upper surfaces of the first and second semiconductor devices 300 and 200 may be exposed. The preliminary molding member 350P may include, for example, a thermosetting resin such as an epoxy resin, a thermoplastic resin such as polyimide, or prepreg, Ajinomoto build-up film (ABF), FR-4, bismaleimide triazine (BT), and epoxy molding compound (EMC), including an inorganic filler and/and glass fiber.

Referring to FIG. 10, a trench T may be formed by removing a portion of the preliminary molding member 350P. The trench T may be formed along the scribe lane region SL and may be formed to have a width greater than a width of the scribe lane region SL. The trench T may be formed by removing the preliminary molding member 350P in the edge regions of the package regions R1, R2, and R3. As the trench T is formed, the preliminary molding member 350P may include upper surfaces having different levels. The preliminary molding member 350P may include a first portion disposed on the upper surface of the interposer 100, and a second portion extending from the first portion in a direction perpendicular to the interposer 100 along the side surfaces of the first and second semiconductor devices 300 and 200. The upper surface of the second portion may be higher than the upper surface of the first portion.

A portion of the preliminary molding member 350P may be removed by laser ablation. In some embodiments, a depth (measured in the vertical direction) of the trench T may be substantially the same as a height of the first and second semiconductor devices 300 and 200, but the inventive concept is not limited thereto. For example, the depth of the trench T may be greater or smaller than the heights of the first and second semiconductor devices 300 and 200.

Referring to FIG. 11, the capping structure 400 may be formed on the preliminary molding member 350P including the trench T. Thereafter, by cutting the interposer 100 and the preliminary molding member 350P on the interposer 100 along the scribe lane region SL, the interposer 100 may be divided into a plurality of the interposer substrates 100 on each of which the first and second semiconductor devices 300 and 200 are mounted.

In some embodiments, the capping structure 400 may be disposed on the upper surface of each of the first and second semiconductor devices 300 and 200, and may be formed on the upper surface of the preliminary molding member 350P to fill the entirety of the trench T. In another embodiment, the capping structure 400 may fill only part of the trench T, and may be formed on the upper surface of the preliminary molding member 350P along the side surface and the upper surface of the trench T. In this case, the capping structure 400b of the semiconductor package 1000b in FIG. 4 may be formed.

The capping structure 400 may be formed of a material having a relatively high coefficient of thermal expansion. The capping structure 400 may be formed of a metal material such as copper (Cu) or steel use stainless (SUS), for example. The capping structure 400 may be formed using, for example, a sputtering process, CVD, or electroplating. The thickness of the capping structure 400 may range from about 0.05 mm to about 0.5 mm, for example. More particularly in relation to some embodiments, the thickness of the capping structure 400 may range from about 0.05 mm to about 0.3 mm, for example.

The interposer 100 and the preliminary molding member 350P on the interposer 100 may be cut along the scribe lane region SL, and the molding member 350 and the capping structure 400 described with reference to FIG. 2 may be formed. For example, the molding member 350 may include a first molding portion 350a between the first and second semiconductor devices 300 and 200, a second molding portion 350b disposed between the side surfaces of the first semiconductor devices 300 and the capping structure 400, and a third molding portion 350c disposed between the capping structure 400 and the interposer 100. For example, the capping structure 400 may include a first capping portion 420 disposed on upper surfaces of the first and second semiconductor devices 300 and 200 and a second capping portion 410 extending from an edge region of the first capping portion 420 toward the interposer 100.

Thereafter, referring back to FIG. 2, the interposer 100 cut along the scribe lane region SL may be attached to the package substrate 10 and the underfill resin 40 may be formed. Thereafter, the stiffener 500 may be attached to the package substrate 10 using the adhesive layer 501.

Figure 12:
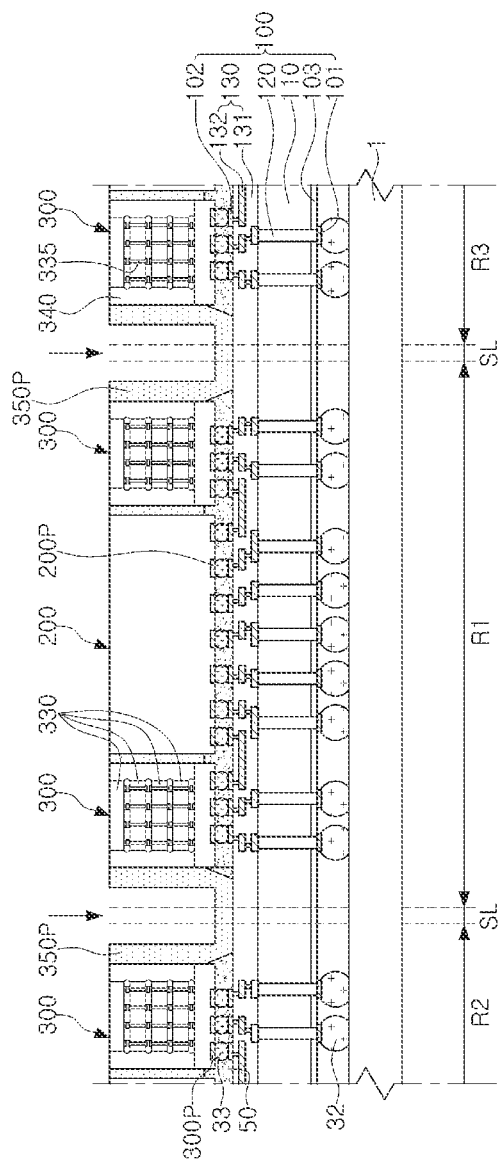
FIG. 12 is a cross-sectional view further illustrating a method of manufacturing a semiconductor package according to embodiments of the inventive concept.

FIG. 12 is another cross-sectional view further illustrating an aspect related to a method of manufacturing a semiconductor package according to embodiments of the inventive concept.

Referring to FIGS. 10 and 12, after the trench T is formed, the interposer 100 and the preliminary molding member 350P on the interposer 100 may be cut along the scribe lane region SL to divide the interposer 100 into a plurality of the interposer 100 on each of which the first and second semiconductor devices 300 and 200 are mounted. Accordingly, the molding member 350 described with reference to FIG. 3 may be formed.

Thereafter, referring to FIGS. 3 and 12, the interposer 100 cut along the scribe lane region SL may be attached to the package substrate 10 and the underfill resin 40 may be formed. Thereafter, the capping structure 400a may be formed on the side surface of the molding member 350. The capping structure 400a may be formed of a material having a relatively high coefficient of thermal expansion. The capping structure 400a may be formed by attaching a stiffener including, such as, for example, a metal material such as copper (Cu) or steel use stainless (SUS). For example, the capping structure 400a may be formed by attaching the capping structure 400a to the third molding portion 350c of the molding member 350 using an adhesive layer. Thereafter, the stiffener 500 may be attached to the package substrate 10. A width of the stiffener 500 attached to the package substrate 10 may be greater than a thickness of the capping structure 400a.

According to the aforementioned embodiments, by including the capping structure on the interposer substrate, a semiconductor package may prove very much less susceptible to warpage across a range of temperatures.

While certain embodiments of the inventive concept have been particularly illustrated and described, it will be apparent to those skilled in the art that various modifications and variations may be made to same without departing from the scope of the inventive concept as defined by the appended claims.

What is claimed is:

1. A semiconductor package, comprising:
   a package substrate;
   an interposer disposed on the package substrate;
   a first semiconductor device mounted on the interposer;
   a second semiconductor device mounted on the interposer adjacent to the first semiconductor device;
   a molding member disposed on the interposer; and
   a capping structure disposed on the molding member,
   wherein the molding member includes a first molding portion disposed between the first semiconductor device and the second semiconductor device, a second molding portion disposed between the first semiconductor device and the capping structure, and a third molding portion disposed between the capping structure and the interposer, and
   wherein the third molding portion extends from a lower region of the second molding portion,
   wherein a lower end of the capping structure contacts an upper surface of the third molding portion, and
   wherein the upper surface of the third molding portion is at a lower level than an upper surface of the second molding portion.

2. The semiconductor package of claim 1, wherein the molding member further includes a bent edge portion formed by a corner combination of the second molding portion and the third molding portion.

3. The semiconductor package of claim 1, wherein the capping structure includes at least one conductive layer, and the capping structure directly contacts the upper surface of the third molding portion.

4. The semiconductor package of claim 3, wherein the at least one conductive layer includes at least one of copper (Cu) and steel use stainless (SUS).

5. The semiconductor package of claim 1, wherein an edge of the interposer, an outer side surface of the third molding portion, and an outer side surface of the capping structure are coplanar.

6. The semiconductor package of claim 1, wherein a thickness of the capping structure is in a range of from 0.05 mm to 0.5 mm.

7. The semiconductor package of claim 1, wherein the capping structure comprises:
a first capping portion horizontally extending to cover upper surfaces of the first semiconductor device and the second semiconductor device; and
a second capping portion vertically descending from an edge of the first capping portion towards the interposer to cover an outer side surface of the second molding portion and the upper surface of the third molding portion.

8. The semiconductor package of claim 7, wherein a thickness of the first capping portion is in a range of from 0.05 mm to 0.5 mm, and a width of the second capping portion is in a range of from 0.1 mm to 0.5 mm.

9. The semiconductor package of claim 7, wherein the capping structure further includes a third capping portion horizontally extending from the second capping portion across the upper surface of the third molding portion, and an upper surface of the third capping portion is lower than the upper surface of the second capping portion.

10. The semiconductor package of claim 1, further comprising:
a stiffener disposed on an upper surface of the package substrate and horizontally spaced apart from the interposer.

11. The semiconductor package of claim 1, wherein the upper surface of the second molding portion is coplanar with upper surfaces of the first semiconductor device and the second semiconductor device.

12. The semiconductor package of claim 1, wherein the first semiconductor device includes a base chip and memory chips stacked on the base chip.

13. The semiconductor package of claim 1, wherein the package substrate includes a lower interconnection structure, and the interposer comprises:
a base substrate;
an upper interconnection layer disposed on an upper surface of the base substrate and including an upper interconnection structure; and
through vias penetrating the base substrate to connect the lower interconnection structure with the upper interconnection structure.

14. A semiconductor package, comprising:
an interposer mounted on a package substrate;
a first semiconductor device and a second semiconductor device mounted on the interposer;
a molding member including an outer side wall portion covering an outer side surface of the first semiconductor device, and a lower portion covering at least a portion of an upper surface of the interposer; and
a capping structure including an outer side wall portion covering the outer side wall portion of the molding member,
wherein an upper surface of the lower portion of the molding member is in direct contact with the outer side wall portion of the capping structure and is at a level lower than an upper surface of the outer side wall portion of the molding member.

15. The semiconductor package of claim 14, wherein the molding member further includes an inner side wall portion filling a gap between the first semiconductor device and the second semiconductor device.

16. The semiconductor package of claim 15, wherein the capping structure further includes an upper portion covering upper surfaces of the outer side wall portion of the molding member and the inner side wall portion of the molding member.

17. The semiconductor package of claim 14, wherein the capping structure further includes a lip portion extending from the outer side wall portion of the capping structure over at least a portion of the lower portion of the molding member.

18. A semiconductor package, comprising:
a package substrate;
an interposer substrate disposed on the package substrate;
first semiconductor chip structures and at least one second semiconductor chip structure spaced apart from each other on the interposer substrate;
a molding member covering at least a side surface of each of the first semiconductor chip structures and the at least one second semiconductor chip structures on the interposer substrate; and
a capping structure disposed on the first and second semiconductor chip structures and the molding member,
wherein the capping structure includes a first capping portion disposed on upper surfaces of the first and second semiconductor chip structures on the interposer substrate, a second capping portion extending from an edge region of the first capping portion in a direction toward the interposer substrate, and a third capping portion extending horizontally from the second capping portion across an upper surface of the molding member, an upper surface of the third capping portion is at a level lower than an upper surface of the second capping portion,
wherein a distance from a lower surface of the package substrate to an upper surface of the package substrate is greater than a distance from an upper surface of the package substrate to upper surfaces of the first and second semiconductor chip structures.

19. The semiconductor package of claim 18, wherein a thickness of the first capping portion is from 0.05 mm to 0.5 mm.

20. The semiconductor package of claim 18, wherein a thickness of the second capping portion is from 0.1 mm to 0.5 mm.

* * * * *